(12) United States Patent
Wang et al.

(10) Patent No.: US 8,786,967 B2
(45) Date of Patent: Jul. 22, 2014

(54) MEMS SNUBBER SYSTEMS AND METHODS

(71) Applicant: DigitalOptics Corporation MEMS, Arcadia, CA (US)

(72) Inventors: Guiqin Wang, Arcadia, CA (US); Roman C. Gutierrez, Arcadia, CA (US)

(73) Assignee: DigitalOptics Corporation MEMS, Arcadia, CA (US)

( * ) Notice: Subject to any disclaimer, the term of this patent is extended or adjusted under 35 U.S.C. 154(b) by 0 days.

(21) Appl. No.: 13/844,140

(22) Filed: Mar. 15, 2013

(65) Prior Publication Data

US 2013/0215525 A1 Aug. 22, 2013

Related U.S. Application Data

(63) Continuation-in-part of application No. 12/946,515, filed on Nov. 15, 2010, now Pat. No. 8,619,378, and a continuation-in-part of application No. 13/427,898, filed on Sep. 28, 2011, and a continuation-in-part of application No. 13/216,225, filed on Aug. 23, 2011, which is a continuation of application No. 12/463,234, filed on May 8, 2009, now Pat. No. 8,004,780, which is a continuation of application No. PCT/US2007/084301, filed on Nov. 9, 2007.

(51) Int. Cl.
*G02B 7/02* (2006.01)

(52) U.S. Cl.
USPC ............................................. 359/823

(58) Field of Classification Search
CPC ............................................. G02B 7/02
USPC ............. 359/811, 822–824; 396/529, 530
See application file for complete search history.

(56) References Cited

U.S. PATENT DOCUMENTS 8,208,208 B2 * 6/2012 Schwab ..................... 359/704

* cited by examiner

*Primary Examiner* — Joseph P Martinez
(74) *Attorney, Agent, or Firm* — Haynes and Boone, LLP

(57) ABSTRACT

Techniques are disclosed for systems and methods to provide concomitant mechanical motion inhibition and electrical distribution for actuator modules, such as microelectromechanical systems (MEMS) based optical actuators adapted to move and/or orient one or more lenses and/or optical devices of a camera module. A mechanical motion inhibition and electrical distribution system may include one or more flexible snubber structures disposed substantially adjacent a MEMS structure and between the MEMS structure and another component of a camera module. Each flexible snubber structure may be implemented with one or more electrical traces, flexible films, snubber films, and/or mechanical stabilizers adapted to route electrical signals to or from the MEMS structure and/or to inhibit mechanical motion of at least a portion of the MEMS structure.

21 Claims, 7 Drawing Sheets

MEMS SNUBBER SYSTEMS AND METHODS

CROSS-REFERENCE TO RELATED APPLICATIONS

This patent application is a continuation-in-part of and claims the benefit of and priority to U.S. patent application Ser. No. 12/946,515 filed Nov. 15, 2010 and entitled "ROTATIONAL COMB DRIVE Z-STAGE" which is hereby incorporated by reference in its entirety.

This patent application is a continuation-in-part of and claims the benefit of and priority to U.S. patent application Ser. No. 13/247,898 filed Sep. 28, 2011 and entitled "MULTIPLE DEGREE OF FREEDOM ACTUATOR" which is hereby incorporated by reference in its entirety.

This patent application is a continuation-in-part of and claims the benefit of and priority to U.S. patent application Ser. No. 13/216,225 filed Aug. 23, 2011 and entitled "INTEGRATED LENS BARREL" which is hereby incorporated by reference in its entirety.

U.S. patent application Ser.No. 13/216,225 is a continuation of U.S. patent application Ser. No. 12/463,234, filed May 8, 2009, and issued as U.S. Pat. No. 8,004,780 on Aug. 23, 2011, which is a continuation of International Application No. PCT/U.S. 2007/084301, filed on Nov. 9, 2007, all of which are hereby incorporated by reference in their entirety. U.S. Provisional Application No. 60/946,217, filed on Jun. 26, 2007 and U.S Provisional Application No. 60/865,143, filed on Nov. 9, 2006, are hereby incorporated by reference in their entirety.

TECHNICAL FIELD

One or more embodiments of the invention relate generally to mechanical motion control of actuators and more particularly, for example, to systems and methods for concomitant mechanical motion inhibition and electrical distribution for actuator modules.

BACKGROUND

Imaging devices are being implemented with more and more features as consumer demand for such features increases over time.

Many such features, such as autofocus and image stabilization, require multiple lenses and other optical devices to be integrated together into the imaging device. At the same time, the imaging devices are themselves being integrated into smaller and more portable electronics devices. As a result, such imaging devices are experiencing larger physical shocks (e.g., a dropped smartphone) in typical use and, due the overall miniaturization, are more prone to damage related to actuator hyperextension and otherwise insufficient and/or unreliable actuator motion inhibition.

Conventional methods used to inhibit actuator motion typically require complex snubber structures that can be difficult and/or expensive to manufacture. Further, increasing snubber complexity typically increases their fragility. Thus, there is a need for an improved methodology to address actuator motion inhibition, particularly in optics assemblies.

SUMMARY

Techniques are disclosed for systems and methods to provide concomitant mechanical motion inhibition and electrical distribution for actuator modules, such as microelectromechanical systems (MEMS) based optical actuators adapted to move and/or orient one or more lenses and/or optical devices of a camera module. In one embodiment, a mechanical motion inhibition and electrical distribution system may include one or more flexible snubber structures disposed substantially adjacent a MEMS structure and between the MEMS structure and another component of a camera module. Each flexible snubber structure may be implemented with one or more electrical traces, flexible films, snubber films, and/or mechanical stabilizers adapted to route electrical signals to or from the MEMS structure and/or to inhibit mechanical motion of at least a portion of the MEMS structure.

In one embodiment, a flexible snubber structure includes a ribbon portion having one or more electrical traces, where the electrical traces are at least partially electrically insulated by a ribbon film; a substantially planar snubber portion having a plurality of mechanical stabilizers embedded in a snubber film; and a folding portion coupling the ribbon portion to the snubber portion, where at least one of the mechanical stabilizers is electrically conductive, and where corresponding ones of the electrical traces are electrically coupled to the electrically conductive mechanical stabilizers.

In another embodiment, a system includes a moveable lens module; a lens barrel; and a flexible snubber structure disposed substantially between the moveable lens module and the lens barrel. In some embodiments, the flexible snubber structure includes a ribbon portion having one or more electrical traces, where the electrical traces are at least partially electrically insulated by a ribbon film; a substantially planar snubber portion having a plurality of mechanical stabilizers embedded in a snubber film; and a folding portion coupling the ribbon portion to the snubber portion, where at least one of the mechanical stabilizers is electrically conductive, and where corresponding ones of the electrical traces are electrically coupled to the electrically conductive mechanical stabilizers.

In a further embodiment, a method includes providing a ribbon portion of a flexible snubber structure, where the ribbon portion has one or more electrical traces, and where the electrical traces are at least partially electrically insulated by a ribbon film; providing a substantially planar snubber portion of a flexible snubber structure, where the substantially planar snubber portion has a plurality of mechanical stabilizers embedded in a snubber film; and providing a folding portion of a flexible snubber structure, where the folding portion couples the ribbon portion to the snubber portion, where at least one of the mechanical stabilizers is electrically conductive, and where corresponding ones of the electrical traces are electrically coupled to the electrically conductive mechanical stabilizers.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
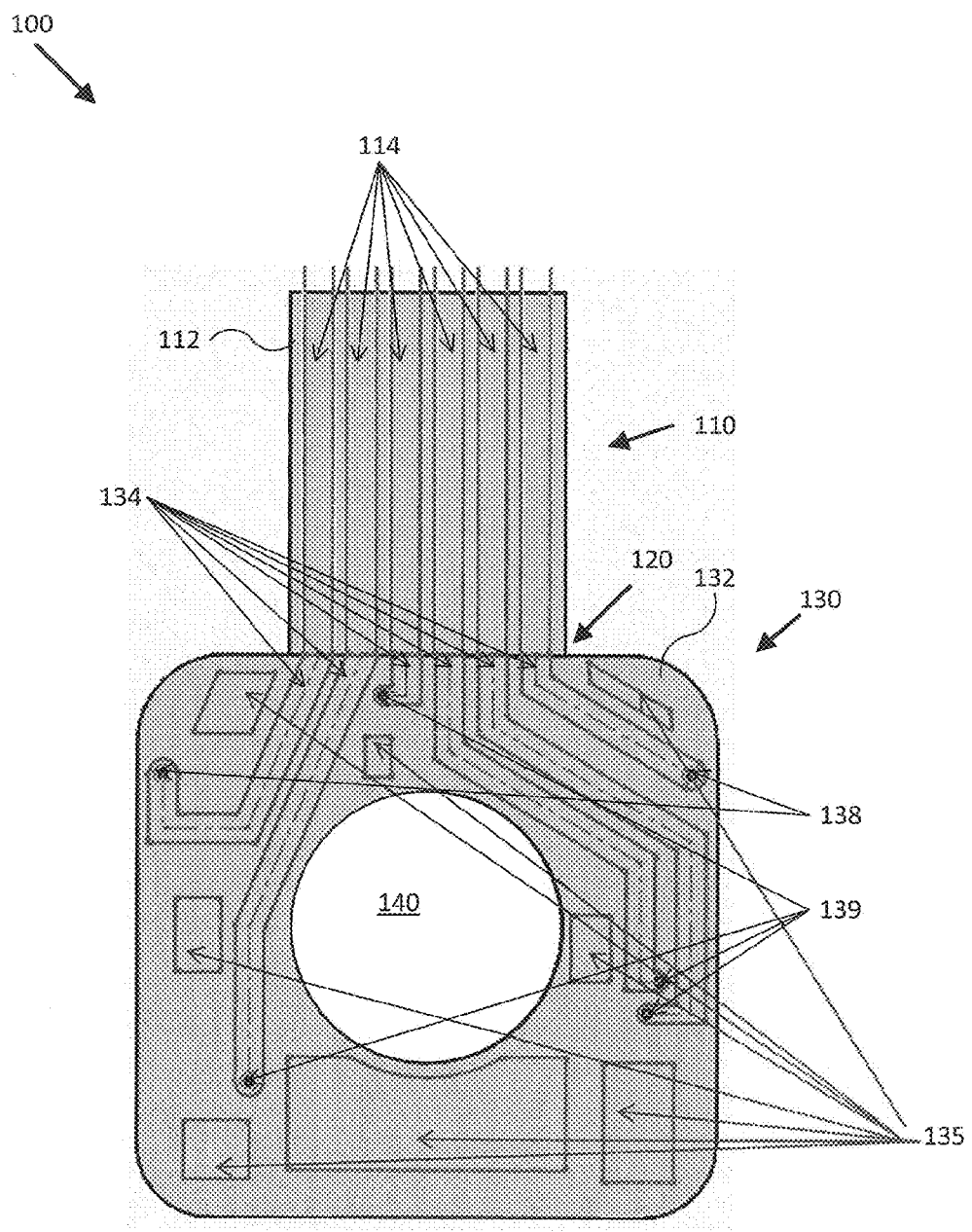
FIG. 1 illustrates a plan view of a flexible snubber structure in accordance with an embodiment of the disclosure.

In accordance with various embodiments of the present disclosure, microelectromechanical systems (MEMS) snubber systems and methods may advantageously include one or more flexible snubber structures disposed substantially adjacent a MEMS structure and between the MEMS structure and another component of a camera module. Each flexible snubber structure may be implemented with one or more electrical traces, flexible films, snubber films, and/or mechanical stabilizers adapted to route electrical signals to or from the MEMS structure and/or to inhibit mechanical motion of at least a portion of the MEMS structure.

By combining snubbing action and electrical distribution in a single structure, smaller actuator modules, optical modules, and camera modules can be achieved, and related assembly can be made simpler due to fewer individualized external wiring connections. Furthermore, embodiments of the present disclosure may be implemented to increase overall tip/tilt alignment of adjacent structures at a reduced fabrication cost, particularly as overall size is reduced.

In one embodiment, a flexible snubber structure may be adapted to provide mechanical stabilizers and/or snubber films of various thicknesses, for example, to inhibit motion of one or more structures according to a particular profile of the structures and/or the desired motion inhibition. In some embodiments, materials used for a flexible snubber structure may be electrically and/or thermally conductive, for example, and such flexible snubber structure may be adapted to thermalize various structures and/or components of a moveable lens module (e.g., actuated by a MEMS actuator) and/or a camera module. In other embodiments, such materials may be electrically and/or thermally insulating, for example, and/or be adapted to provide a particular type of motion inhibition, such as "soft" motion inhibition adapted to minimize shock damage (e.g., as opposed to more rigid motion inhibition adapted to minimize hyper extension of moveable actuator structures).

In the context of the present disclosure, a snubber may be any structure adapted to inhibit and/or help inhibit motion of another structure through constant and/or intermittent mechanical contact. For example, a snubber for an actuator may include one or more surfaces, each having a particular orientation and/or profile, for instance, that are adapted to hard limit motion of a portion of the actuator. In one embodiment, one such surface may help to inhibit all relative motion of a fixed frame of a MEMS actuator, for example, by pressing the fixed frame against an opposite surface, for instance, or by compliantly molding around at least portions of the fixed frame to keep it relatively stationary. In another embodiment, another such surface may inhibit motion of a moveable fame of the MEMS actuator in the actuated range of motions, so as to allow typical actuator motion but minimize and/or eliminate hyperextension of the actuator. In other embodiments, yet another such surface may inhibit motion of the moveable frame in directions other than those in the actuated range of motions, so as to allow typical actuator motion but reduce and/or eliminate a risk of actuator damage due to shock (e.g., a relatively large external force applied suddenly to the actuator in a direction substantially orthogonal to the actuated range of motions).

FIG. 1 illustrates a plan view of a flexible snubber structure 100 in accordance with an embodiment of the disclosure. In the embodiment shown in FIG. 1, system 100 includes flexible ribbon portion 110 and snubber portion 130 coupled to each other by folding portion 120. For example, ribbon portion 110, folding portion 120, and snubber portion 130 may be formed substantially in a plane, for example, and folding portion 120 may be adapted to flex and/or fold away from the plane to facilitate various electrical connections between ribbon portion 110 and other components of a camera module, for example, or an encompassing electronic device (e.g., a personal electronic device, such as a digital camera or a smartphone). In some embodiments, folding portion 120 may be implemented with one or more flexible films, snubber films, film interfaces, flexible conductive layers (e.g., metal layers), and/or stiffeners. In one embodiment, a flexible conducting layer of folding portion 120 may comprise the same conducting layer forming electrical traces 114 of ribbon member 110 and/or electrical traces 134 or mechanical stabilizers 135 of snubber portion 130.

As shown in FIG. 1, flexible ribbon portion 110 may include ribbon film 112 and one or more flexible electrical traces 114. In various embodiments, ribbon portion 110 may be adapted to route one or more electrical signals from a suitable ribbon cable interface, for example, along a potentially curved path, and to electrical traces 134 in snubber portion 130. In one embodiment, ribbon film 112 may be implemented with a suitable dielectric material, such as Mylar, Kapton, a fiber reinforced resin, and/or other flexible materials, for example, and, in some embodiments, may be implemented with a stiffener material added to at least a portion of ribbon film 112 to provide mechanical stiffness for insertion of an end of ribbon portion 110 into a suitable connector (e.g., mounted in or on a camera module and/or an encompassing electronic device, for example).

In further embodiments, ribbon film 112 may be mated with ribbon film 116 (e.g., shown in FIG. 2) to sandwich opposing sides of electrical traces 114 in, for example, flexible insulating, stiffening, and/or otherwise protective material. Ribbon film 116 may be formed, patterned, stiffened, or otherwise applied to ribbon portion 110 using any one or combination of techniques described herein, and may or may not exhibit the same general characteristics of ribbon film 112 (e.g., they may differ in material, thickness, stiffness, thermal and/or electrical conductivity, and in various other characteristics).

Electrical traces 114 may be implemented as a patterned conductive layer (e.g., a copper layer) deposited and/or otherwise formed or attached to ribbon film 112 (e.g., and/or ribbon film 116), as described herein. In various embodiments, electrical traces 114 may be adapted to couple to electrical traces 134 and route electrical signals (e.g., including electrical power) to and from snubber portion 130. In one embodiment, electrical traces 114 may be patterned (e.g., using various lithography techniques, for example) with electrical traces 134 and/or mechanical stabilizers 135 of snubber portion 130 from a single sheet of conductive material. In such embodiment, electrical traces 114 may be mated with ribbon films 112 and/or 116 prior to, during, or after the patterning process. A thickness and/or width of electrical traces 114 may be adapted according to a desired impendence of electrical traces 114, for example.

Although ribbon film 112 is shown in FIG. 1 as encompassing the width and breadth of ribbon portion 110, in other embodiments, ribbon film 112 (and/or ribbon film 116) may be patterned to substantially match individual profiles of electrical traces 114, for example, or according to other patterns. Such patterns may be used, in addition to and/or along with various stiffener materials (e.g., which may or may not be patterned similarly), to adjust an overall stiffness of flexible ribbon portion 110.

Also shown in FIG. 1 is snubber portion 130, which may include snubber film 132, one or more electrical traces 134, one or more mechanical stabilizers 135, one or more electrical contacts 138 and 139, and aperture 140. In various embodiments, snubber portion 130 may be adapted to route one or more electrical signals from ribbon portion 110 to electrical contacts 138, 139. In further embodiments, snubber portion 130 may be adapted to act as a snubber for adjacent structures (e.g., one or more optical MEMS structures) and inhibit and/or help inhibit motion of the adjacent structures through substantially constant and/or intermittent mechanical contact with the structures, as described herein. As such, snubber portion 130 may be implemented with various surface and side profiles to match an opposing surface of an adjacent structure.

In one embodiment, snubber portion 130 may be substantially planar, as shown in FIG. 1, and may be implemented to provide substantially aligned opposing flat surfaces to adjacent structures. Aperture 140 may be adapted to act as a circular optical aperture of a moveable lens module and/or a camera module, as described herein. In some embodiments, aperture 140 may have a circular shape, for example, or a square, rectangular, or oval shape in order to match a particular adjacent structure or optical aperture need, for example.

In one embodiment, snubber film 132 may be implemented with a suitable dielectric material, such as Mylar, Kapton, a fiber reinforced resin, an encapsulated foam, and/or other flexible, insulating, and/or snubbing materials, for example. In some embodiments, snubber film 132 may be implemented with a stiffener material added to at least a portion of snubber film 132 to provide mechanical stiffness for supporting an electrical connection disposed on any one of electrical contacts 138, 139, for example, or for providing a particular type of motion inhibition. In some embodiments, snubber film 132 may be patterned with ribbon film 112 from a single sheet of material. In related embodiments, additional material layers may be added to the portion of the sheet corresponding to snubber film 132 to adjust its stiffness, its type of snubber action, or a profile of any one of its surfaces (e.g., to provide a particular motion inhibition), as described herein. More generally, snubber film 132 may be implemented with one or more thicknesses that are greater than, the same as, or less than a thickness of ribbon film 112.

In further embodiments, snubber film 132 may be mated with snubber film 136 (e.g., shown in FIG. 2) to sandwich opposing sides of electrical traces 134 and/or mechanical stabilizers 135 in, for example, flexible, insulating, stiffening, snubbing, and/or otherwise protective material. Snubber film 136 may be formed, patterned, stiffened, or otherwise applied to snubber portion 130 using any one or combination of techniques described herein, and may or may not exhibit the same general characteristics of snubber film 132 (e.g., they may differ in material, thickness, stiffness, snubbing type, thermal and/or electrical conductivity, and in various other characteristics).

Although snubber film 132 is shown in FIG. 1 as encompassing the width and breadth of snubber portion 130, in other embodiments, snubber film 132 (and/or snubber film 136) may be patterned to substantially match individual profiles of electrical traces 134 and/or mechanical stabilizers 135, for example, or according to other patterns. Such patterns may be used, in addition to and/or along with various stiffener materials (e.g., which may or may not be patterned similarly), to adjust localized and/or overall stiffness, flexibility, and/or snubber type of snubber portion 130. For example, in one embodiment, one or more electrical traces 134 and/or mechanical stabilizers 135 may be embedded in snubber film 132, where at least a portion of a surface (e.g., a side, top, or bottom surface) of the embedded traces and/or stabilizers is attached to snubber film 132. In some embodiments, an electrical trace or mechanical stabilizer embedded in snubber film 132 may have portions of each of its surfaces that are not attached to snubber film 132 (e.g., where snubber film 132 comprises a web-like structure with strands that are smaller than one or more surfaces of the trace/stabilizer).

Electrical traces 134 may be implemented as a patterned conductive layer (e.g., a copper layer) deposited and/or otherwise formed or attached to snubber film 132 (e.g., and/or snubber film 136), as described herein. In various embodiments, electrical traces 134 may be adapted to couple electrically to electrical traces 114 and route electrical signals between electrical traces 114 and electrical contacts 138, 139. In additional embodiments, electrical traces 134 may be adapted to provide mechanical stabilization and/or snubbing to structures adjacent to snubber portion 130, similar to mechanical stabilizers 135, described herein. Thus, in some embodiments, electrical traces 134 may be adapted to provide both electrical distribution and mechanical stabilization, and, in various embodiments, may be interchangeable with mechanical stabilizers 135, such that only an electrical coupling with electrical traces 114 distinguishes electrical traces 124 from mechanical stabilizers 135. In some embodiments, electrical traces 134 may optionally be referred to as mechanical stabilizers.

In one embodiment, electrical traces 134 may be patterned (e.g., using various lithography techniques, for example) with mechanical stabilizers 135 from a single sheet of conductive material, such as a metal. In such embodiment, electrical traces 134 may be mated with snubber films 132 and/or 136 prior to, during, or after the patterning process. A thickness, width, profile, and/or pattern of electrical traces 134 may be adapted according to a desired impendence, a desired footprint or profile of an adjacent structure to be snubbed, and/or a type of snubbing action to be provided by electrical traces 134, for example.

Mechanical stabilizers 135 may be implemented as a patterned layer of material deposited and/or otherwise formed or attached to snubber film 132 (e.g., and/or snubber film 136), as described herein. In various embodiments, mechanical stabilizers 135 may be adapted to provide one or more surfaces for mechanically stabilizing and/or snubbing structures adjacent to snubber portion 130, as described herein. For example, each mechanical stabilizer 135 may have an individual thickness, shape, and/or profile adapted to inhibit motion of a particular adjacent structure (e.g., a MEMS actuator structure) in a particular way (e.g., to provide shock protection, hyperextension protection, and/or general stability), as described herein. In other embodiments, all mechanical stabilizers 135 may have the same thickness to help ensure overall tip/tilt alignment of adjacent structures and/or to facilitate camera module assembly convenience and/or reliability.

In various embodiments, mechanical stabilizers 135 may be implemented as a patterned conductive layer (e.g., a copper layer) deposited and/or otherwise formed or attached to snubber film 132 (e.g., and/or snubber film 136), as described herein. More generally, any one of mechanical stabilizers 134 may be implemented in a thermally and/or electrically conductive and/or non-conductive material, for example. For example, any one of mechanical stabilizers 134 may be adapted to thermalize or insulate adjacent structures and/or other portions of structure 100. In embodiments where mechanical stabilizers 135 are implemented in electrically conductive material, they may be adapted to couple electrically to electrical traces 113 and route electrical signals similar to related functions of electrical traces 134. Thus, in some embodiments, mechanical stabilizers 135 may be adapted to provide both electrical distribution and mechanical stabilization.

In one embodiment, mechanical stabilizers 135 may be patterned (e.g., using various lithography techniques, for example) with electrical traces 134 from a single sheet of conductive material, such as a metal. In such embodiment, mechanical stabilizers 135 IS may be mated with snubber films 132 and/or 136 prior to, during, or after the patterning process. In some embodiments, snubber portion 130 may additionally be implemented with a small set of electrical traces (not shown in FIG. 1) adapted to reduce a risk of charge build up on one or more of mechanical stabilizers 135. In related embodiments, one or more of mechanical stabilizers 135 may be electrically coupled to one of electrical traces 132 designated as an electrical ground.

Electrical contacts 138 and 139 may be adapted to route electrical signals to corresponding components of one or more adjacent structures, for example, such as one or more actuators of a moveable lens module, as described herein. In some embodiments, electrical contacts 138 and 139 may be implemented as one or more vias, solder pads, and/or electrical patches, for example, strategically located in areas that minimize additional wiring needed to electrically interface with one or more MEMS actuators.

In one embodiment, electrical contacts 138 may be adapted to interface with an autofocus (AF) MEMS actuator, and electrical contacts 139 may be adapted to interface with an optical image stabilization (OIS) MEMS actuator, as described herein.

In some embodiments, where one or more of mechanical stabilizers 135 are electrically conductive (e.g., where electrical traces 134 and mechanical stabilizers 135 are substantially interchangeable), the number of electrical traces/electrically conductive mechanical stabilizers 134/135 may be equal to or greater than the number of electrical traces 114. In such embodiments, each one of electrical traces 114 may be coupled to at least one electrical trace/electrically conductive mechanical stabilizer 134/135. In some embodiments (e.g., where there are more electrical traces/electrically conductive mechanical stabilizers 134/135 than electrical traces 114) the remaining mechanical stabilizers may be implemented with a different thickness, for example, so as to mate with a particular profile of an adjacent structure, for example. In other embodiments, all traces and stabilizers may be the same thickness (e.g., when they are all patterned out of the same sheet of material, for example).

Figure 2:
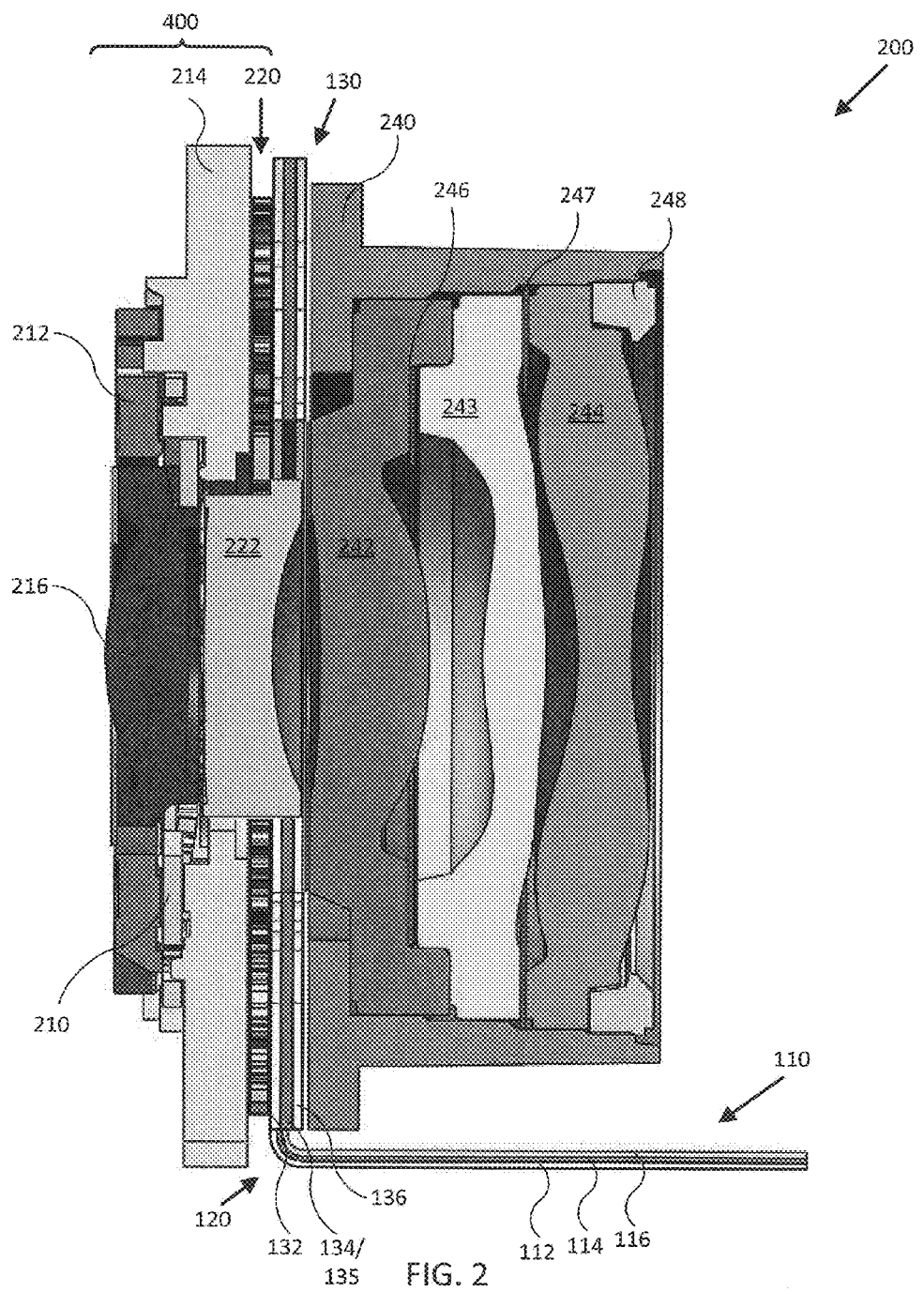
FIG. 2 illustrates a cross section view of a camera module including a flexible snubber structure in accordance with an embodiment of the disclosure.

FIG. 2 illustrates a cross section view of a camera module 200 including flexible snubber structure 100 (e.g., ribbon portion 110, folding portion 120, snubber portion 130) in accordance with an embodiment of the disclosure. In one embodiment, portions of camera module 200 may be implemented according to various techniques, structures, arrangements, and other methodologies set forth in U.S. patent application Ser. No. 13/216,225 filed Aug. 23, 2011, which is incorporated herein by reference in its entirety. In another embodiment, portions of camera module 200 (e.g., MEMS actuators 210 and/or 220) may be implemented according to various techniques, structures, arrangements, and other methodologies set forth in U.S. patent application Ser. No. 12/946,515 filed Nov. 15, 2010 which is incorporated herein by reference in its entirety. In another embodiment, portions of camera module 200 (e.g., MEMS actuators 210 and/or 220) may be implemented according to various techniques, structures, arrangements, and other methodologies set forth in U.S. patent application Ser. No. 13/247,898 filed Sep. 28, 2011 which is incorporated herein by reference in its entirety.

In the embodiment shown in FIG. 1, camera module 200 includes moveable lens module 400, lens barrel 240, and flexible snubber structure 100 (e.g., ribbon portion 110, folding portion 120, snubber portion 130) disposed substantially between moveable lens module 400 and lens barrel 240.

In one embodiment, moveable lens module 400 may be implemented as an assembly of AF MEMS actuator 210, lens 216, close focus snub 212, infinite focus snub 214, OIS MEMS actuator 220, and lens 222. In various embodiments, moveable lens module 400 may be adapted to transform electrical signals into motion of lenses 216 and/or 222 to focus, zoom, optically stabilize, or perform other optical processing techniques on light passing through moveable lens module 400. In one embodiment, AF MEMS 210 and OIS MEMS 220 may be adapted to operate and perform designated functions independently, for example, and in other embodiments, they may be adapted to operate and perform a variety of optical processing functions collaboratively. In further embodiments, AF MEMS 210 and OIS MEMS 220 may be implemented in a single monolithic MEMS actuator.

As shown in FIG. 2, close focus snub 212 may be adapted to inhibit motion of AF MEMS 210 and/or lens 216 when camera module 200 is imaging an object close to lens 216 (e.g., when an actuator structure of AF MEMS 210 and/or lens 216 is close to and/or contacting close focus snub 212), and infinite focus snub 214 may be adapted to inhibit motion of AF MEMS 210 and/or lens 216 when camera module 200 is imaging an object far from lens 216 (e.g., when an actuator structure of AF MEMS 210 and/or lens 216 is close to and/or contacting infinite focus snub 214). In addition, as can be seen from FIG. 2, infinite focus snub 214 may be adapted to help inhibit motion of one or more portions of OIS MEMS 220 and/or lens 222. In various embodiments, lens barrel 240 may be adapted to house and/or provide structural support for a variety of optical devices, including lenses 242-244 and/or associates spacers/snubbers 246-248.

Also shown in FIG. 2 are flexible ribbon portion 110, folding portion 1200, and snubber portion 130 of flexible snubber structure 100. As shown in FIG. 2, folding portion 120 allows flexible ribbon portion to follow a side profile of lens barrel 240 while providing various electrical signals over electrical traces 114 and insulated by ribbon films 112 and/or 116. Also as shown in FIG. 2, snubber portion 130 may include electrical traces 134/mechanical stabilizers 135 sandwiched between top snubber film 132 and bottom snubber film 136, each of which are thicker than electrical traces 114 and ribbon films 112, 116, respectively. As noted herein, each of electrical traces 134, mechanical stabilizers 135, top snubber film 132, and/or bottom snubber film 136 may be adapted to help inhibit motion (e.g., with help from infinite focus snub 214, in some embodiments) of an adjacent structure, such as one or more portions of OIS MEMS 220, lens 222, lens barrel 240, and/or lens 242.

In some embodiments, flexible snubber structure 100 and AF MEMS 210 and/or OIS MEMS 220 may be integrated with lenses 212 and 222 to form a moveable lens module (e.g., moveable lens module 400) including flexible snubber structure 100, as described herein. In further embodiments, moveable lens module 400 including flexible snubber structure 100 may be coupled to and/or integrated with lens barrel 240 and various optical devices (e.g., lenses 242-244, spacers/snubbers 246-248, various irises, shutters, filters, and other optical devices) structurally supported by lens barrel 240 to form camera module 200. Camera module 200 can be integrated with (e.g., electrically coupled to, soldered to, mechanically coupled to) a digital camera, a smartphone, a personal digital assistant, a tablet computer, a notebook computer, a kiosk (e.g., a sales kiosk, an ATM, and/or other types of kiosks), a portable electronic device, and/or other electronic devices, for example.

Figure 3:
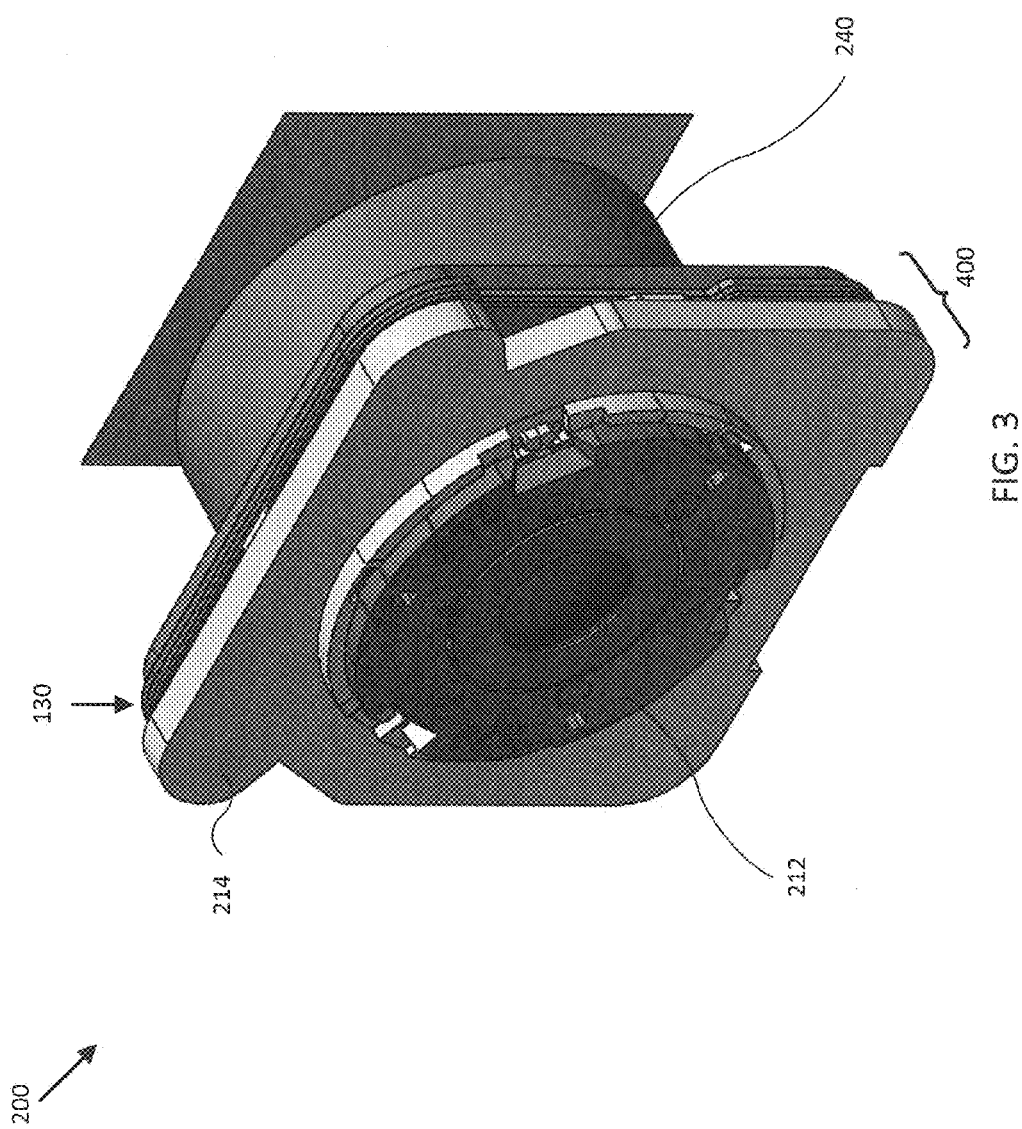
FIG. 3 illustrates a perspective view of the camera module in FIG. 2 in accordance with an embodiment of the disclosure.

FIG. 3 illustrates a perspective view of the camera module in FIG. 2 in accordance with an embodiment of the disclosure. As shown in FIG. 3, elements of camera module 200 may be arranged relatively compactly utilizing the electrical distribution and snubbing features of flexible snubber structure 100. For example, in contrast to various electrical leads and spacers servicing various MEMS actuators and lenses contained within the spaces between close focus snub 212 and infinite focus snub 214, infinite focus snub 214 and snubber portion 130, and between snubber 130 and lens barrel 240, embodiments of the present disclosure supply all such leads and at least a portion of the snubbing action through application of ribbon portion 110, folding portion 120, and snubber portion 130 of flexible snubber structure 100.

Figure 4:
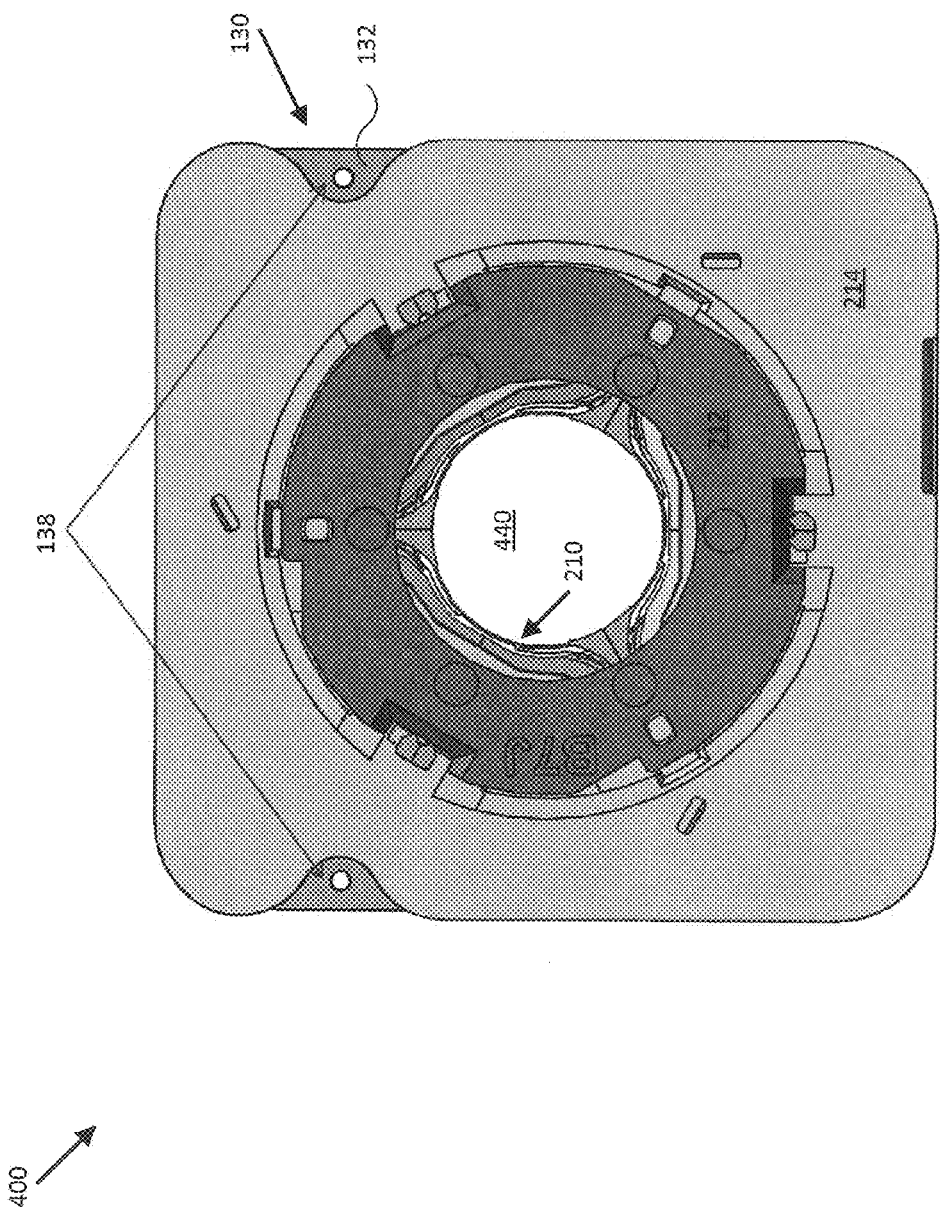
FIG. 4 illustrates a first plan view of a moveable lens module including a flexible snubber structure in accordance with an embodiment of the disclosure.

FIG. 4 illustrates a first plan view of moveable lens module 400 including snubber portion 130 of flexible snubber structure 100 in accordance with an embodiment of the disclosure. As shown in FIG. 4, strategic placement of electrical contacts 138 accessible through snubber film 132 of snubber portion 130 provide simplified routing of electrical signals to, for example, AF MEMS actuator 210 disposed substantially between close focus snub 212 and infinite focus snub 214. In some embodiments, aperture 440 may be substantially defined by aperture 140 in snubber portion 130, for example.

Figure 5:
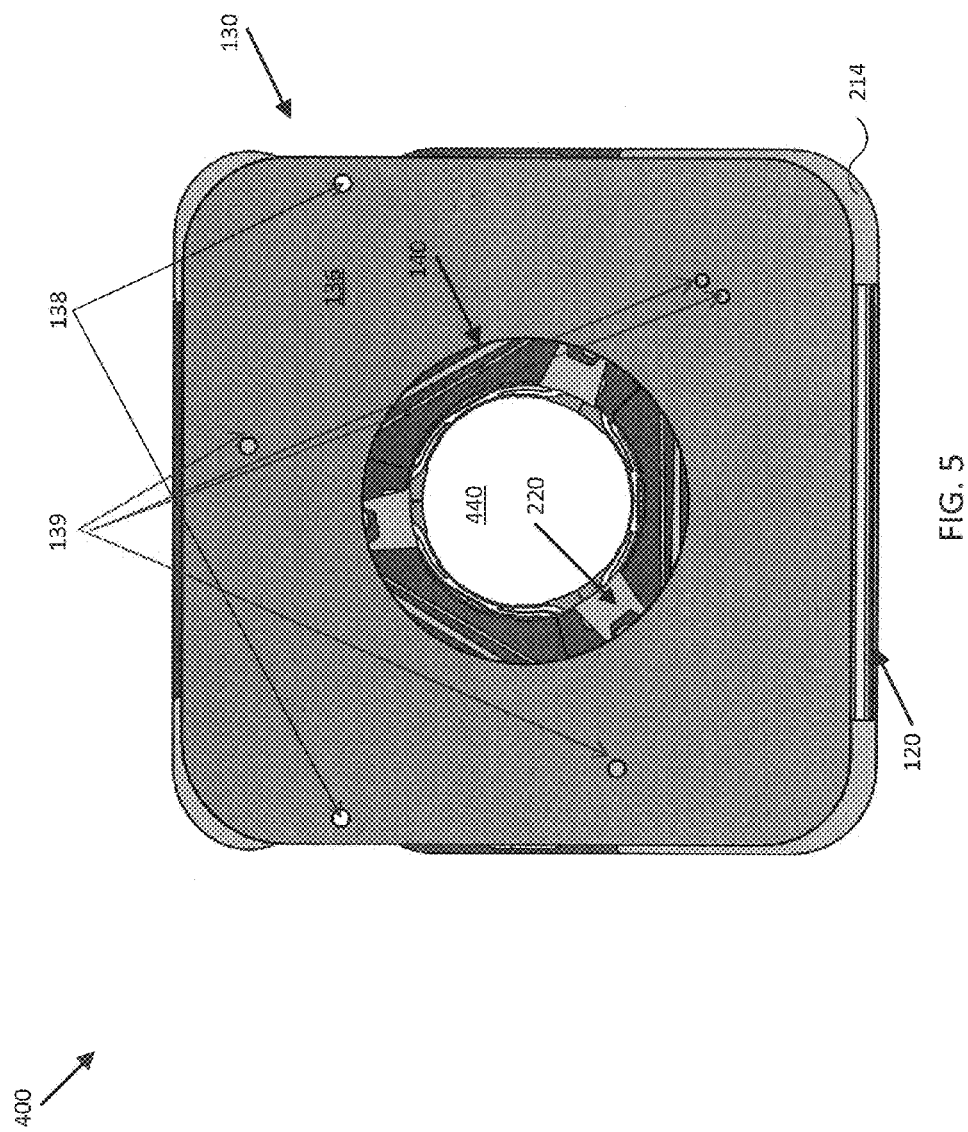
FIG. 5 illustrates a second plan view of the moveable lens module in FIG. 4 in accordance with an embodiment of the disclosure.

FIG. 5 illustrates a second plan view of moveable lens module 400 including folding portion 120 and snubber portion 130 of flexible snubber structure 100 in accordance with an embodiment of the disclosure. It should be appreciated that both electrical contacts 138 and 139 are typically only visible from the bottom view presented in FIG. 5 when snubber film 136 is substantially transparent. Their placement is provided in FIG. 5 for clarity of description. As shown in FIG. 5, strategic placement of electrical contacts 139 accessible through snubber film 132 (e.g., shown in FIGS. 1, 2 and 4) of snubber portion 130 provide simplified routing of electrical signals to, for example, OIS MEMS actuator 220 disposed substantially between infinite focus snub 214 and snubber portion 130 of flexible snubber structure 100. In some embodiments, aperture 440 may be substantially defined by aperture 140 in snubber portion 130, for example. In other embodiments, such as that shown in FIG. 5, aperture 140 may provide for OIS movement of lens 222 in FIG. 2.

Figure 6:
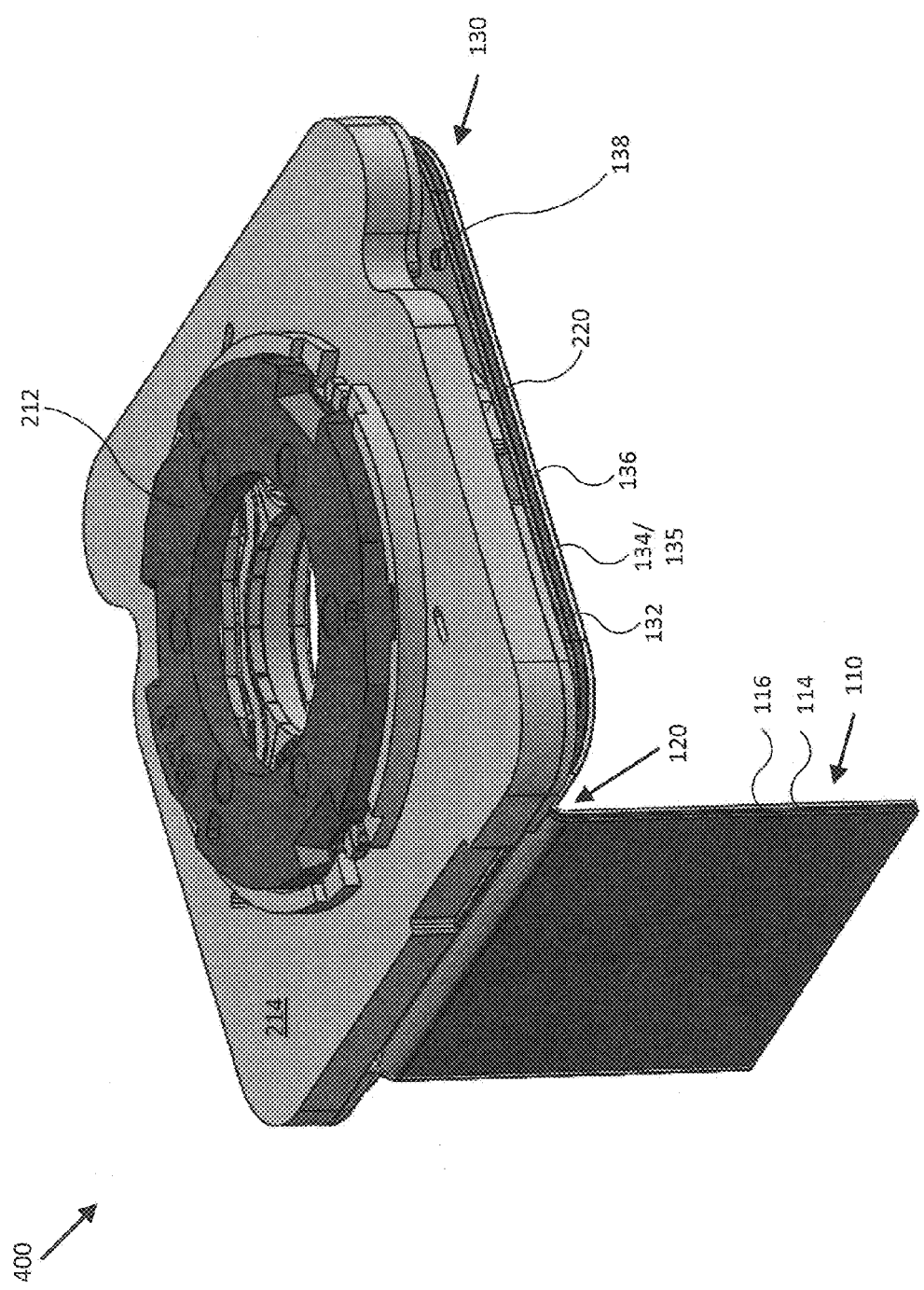
FIG. 6 illustrates a perspective view of the moveable lens module in FIGS. 4 and 5 in accordance with an embodiment of the disclosure.

FIG. 6 illustrates a perspective view of moveable lens module 400 including ribbon portion 110, folding portion 120 and snubber portion 130 of flexible snubber structure 100 in accordance with an embodiment of the disclosure. As shown in FIG. 6, snubber film 132 is substantially disposed on a top side of electrical traces/mechanical stabilizers 134/135 and between electrical traces/mechanical stabilizers 134/135 and OIS MEMS 220, snubber film 136 is substantially disposed on a bottom side of electrical traces/mechanical stabilizers 134/135, and each of snubber film 132, snubber film 136, and electrical traces/mechanical stabilizers 134/135 may be adapted to inhibit mechanical motion of OTS MEMS 220 (e.g., with the help of lens barrel 240).

Figure 7:
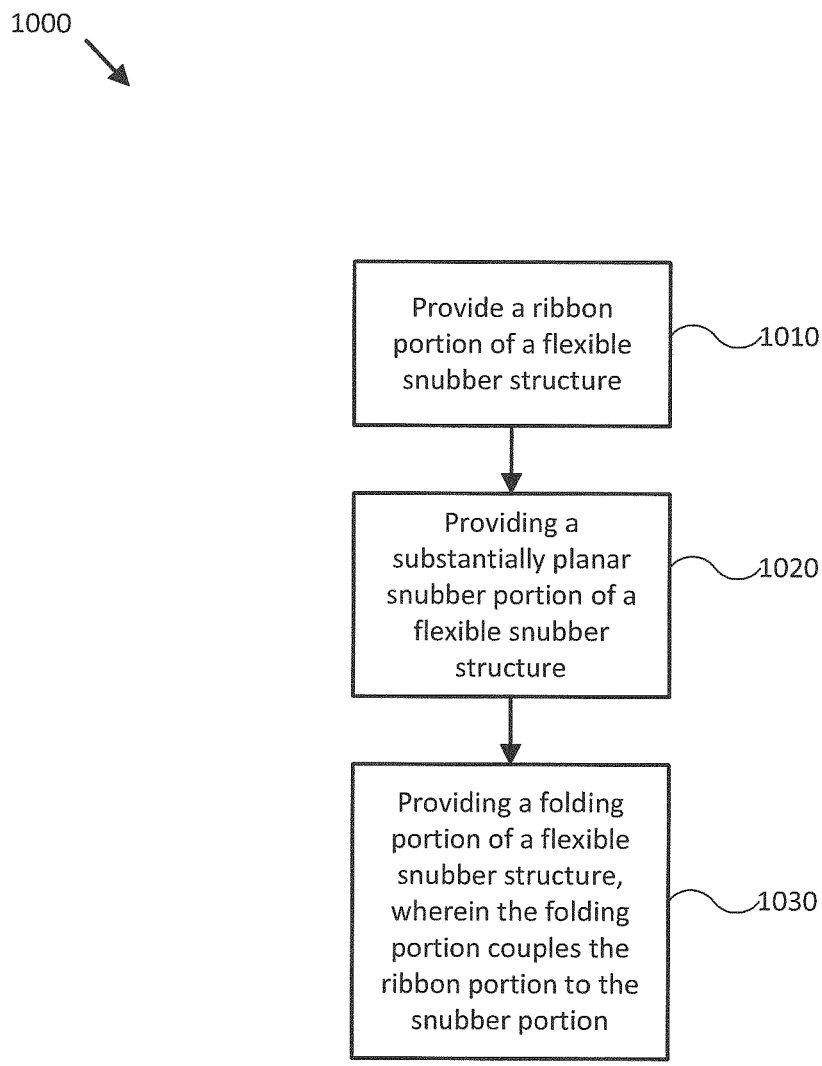
FIG. 7 illustrates a flow diagram of various operations to provide actuator motion control in accordance with an embodiment of the disclosure.

FIG. 7 illustrates a flow diagram of process 1000 to provide actuator motion control in accordance with an embodiment of the disclosure. In some embodiments, the operations of process 1000 may be implemented as software instructions executed by one or more logic devices used to implement a fabrication and/or assembly process. More generally, the operations of process 1000 may be implemented with any combination of software instructions, electronic hardware (e.g., inductors, capacitors, amplifiers, or other analog and/or digital components), and/or mechanical hardware used in a fabrication and/or assembly process, such as a MEMS fabrication process, for example, and/or a semiconductor fabrication process.

It should be appreciated that any step, sub-step, sub-process, or block of process 1000 may be performed in an order or arrangement different from the embodiment illustrated by FIG. 7. Further, in some embodiments, any number of processes similar to process 1000 may be performed substantially simultaneously to produce multiple instances of flexible snubber structures throughout a camera module, for example. Although process 1000 is described with reference to system 100, process 1000 may be performed according to systems different from system 100 and including a different selection of electrical, optical, structural, and/or snubber requirements.

In block 1010, a flexible snubber structure assembly process includes providing a ribbon portion of a flexible snubber structure. For example, in one embodiment, a fabrication and/or assembly system may be adapted to provide flexible ribbon portion 110 by forming electrical traces 114 and then applying flexible ribbon film 112, where electrical traces 114 are at least partially electrically insulated by ribbon film 112.

In some embodiments, ribbon film 112 may be formed from one or more dielectric materials (e.g., glass, ruby, various polymers, Mylar, Kapton, a fiber reinforced resin, other flexible materials, and/or stiffeners), using a variety of depositing, painting, growing, patterning, shaping, molding, casting, or other film formation techniques, and/or other fabrication processes, for example. In additional embodiments, electrical traces 114 may be formed from one or more conductive materials (e.g., metal foils, strips, wires, braids, and/or other flexible conductive materials), using a variety of depositing, growing, patterning, shaping, molding, casting, extruding, or other conductive trace formation techniques, and/or other fabrication processes, for example.

In various embodiments, block 1010 may be performed substantially simultaneously with process steps used to form other portions of flexible snubber structure 100 and/or provide other flexible snubber structures, for example. In some embodiments, block 1010 may be implemented to produce ribbon portion 110 according to a particular desired flexibility.

In block 1020, a flexible snubber structure assembly process includes providing a substantially planar snubber portion of a flexible snubber structure. For example, in one embodiment, a fabrication and/or assembly system may be adapted to provide snubber portion 130 by forming electrical traces 134 and/or mechanical stabilizers 135 and then applying snubber film 132, and/or forming electrical contacts 138, 139 and/or aperture 140, where electrical traces 134 and/or mechanical stabilizers 135 are embedded in snubber film 132.

In some embodiments, snubber film 132 may be formed from one or more dielectric materials (e.g., glass, ruby, various polymers, Mylar, Kapton, a fiber reinforced resin, an encapsulated foam, other flexible materials, stiffeners, and/or thermally conductive materials), using a variety of depositing, painting, growing, patterning, shaping, molding, casting, or other film formation techniques, and/or other fabrication processes, for example. In additional embodiments, electrical traces 134 may be formed from one or more conductive materials (e.g., metal foils, strips, wires, braids, and/or other flexible conductive materials), using a variety of depositing, growing, patterning, shaping, molding, casting, extruding, or other conductive trace formation techniques, and/or other fabrication processes, for example.

In further embodiments, mechanical stabilizers 135 may be formed from any of the materials used to form ribbon film 112, snubber film 132, and/or electrical traces 134, for example, using any of the various material formation techniques and/or other fabrication processes described herein. In still further embodiments, electrical contacts 138, 139 may be formed in or on electrical traces 134, and aperture 140 may be formed in snubber portion 130, using a variety of stripping, soldering, drilling, punching, or other electrical contact and/or aperture formation techniques and/or other fabrication processes, for example.

In various embodiments, block 1020 may be performed substantially simultaneously with process steps used to form other portions of flexible snubber structure 100 and/or provide other flexible snubber structures, for example. In some embodiments, block 1020 may be implemented to produce snubber portion 110 according to a particular desired shape, profile, footprint, thickness, flexibility, stiffness, electrical contact pattern, stability and/or snubbing pattern.

In block 1030, a flexible snubber structure assembly process includes providing a folding portion of a flexible snubber structure. For example, in one embodiment, a fabrication and/or assembly system may be adapted to provide folding portion 120 by coupling electrical traces 114 of ribbon portion 110 to electrical traces/mechanical stabilizers 134/135 of snubber portion 130. In one embodiment, at least one of electrical traces 134 is functionally interchangeable with one of mechanical stabilizers 125, for example, as long as the particular mechanical stabilizer is electrically conductive.

In some embodiments, such electrical coupling may be made through use of a variety of welding, soldering, pressing, conductive adhesives, or other electrical coupling techniques, and/or other fabrication processes, for example. In additional embodiments, block 1030 may include coupling ribbon film 112 to snubber film 132 and/or ribbon film 116 to snubber film 136. Such coupling can be made through use of a variety of crimping, adhesives, melting, welding, or other material coupling techniques and/or other fabrication processes, for example.

In various embodiments, block 1030 may be performed substantially simultaneously with process steps used to form other portions of flexible snubber structure 100 and/or provide other flexible snubber structures, for example. In some embodiments, block 1030 may be implemented to produce folding portion 120 according to a particular desired shape, profile, footprint, thickness, flexibility, stiffness, electrical contact pattern, stability and/or folding pattern.

In additional embodiments, a fabrication and/or assembly system may be adapted to provide flexible snubber structure 100 from various relatively large sheets of materials that are common to ribbon portion 110, folding portion 120, and snubber portion 130. For example, ribbon film 112 and snubber film 132 may be patterned from the same sheet of material so that they form a single piece of film for all three portions of flexible snubber structure 100. Similarly, electrical traces 114 and electrical traces/mechanical stabilizers 134/135 may all be patterned from a single sheet of conductive material (e.g., copper foil). Such fabrication techniques substantially simplify and reduce the cost of fabrication of flexible snubber structure 100.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A flexible snubber structure, comprising:
a ribbon portion comprising one or more electrical traces, wherein the electrical traces are at least partially electrically insulated by a ribbon film;
a substantially planar snubber portion comprising a plurality of mechanical stabilizers embedded in a snubber film; and
a folding portion coupling the ribbon portion to the snubber portion, wherein at least one of the mechanical stabilizers is electrically conductive, and wherein corresponding ones of the electrical traces are electrically coupled to the electrically conductive mechanical stabilizers.

2. The flexible snubber structure of claim 1, wherein:
a first number of the electrically conductive mechanical stabilizers is equal to or greater than a second number of the electrical traces; and
each one of the electrical traces is electrically coupled to at least one electrically conductive mechanical stabilizer.

3. The flexible snubber structure of claim 2, wherein:
the first number is greater than the second number;
each of the mechanical stabilizers is electrically conductive;
the mechanical stabilizers electrically coupled to the electrical traces comprise a first thickness; and
the mechanical stabilizers not electrically coupled to the electrical traces comprise a second thickness different from the first thickness.

4. The flexible snubber structure of claim 1, wherein:
the electrical traces and the mechanical stabilizers comprise substantially the same thickness.

5. The flexible snubber structure of claim 1, wherein:
each of the electrically conductive mechanical stabilizers comprise at least one electrical contact; and
one or more patterns of the electrically conductive mechanical stabilizers are adapted to route electrical signals between corresponding electrical traces and electrical contacts.

6. The flexible snubber structure of claim 1, wherein:
the snubber film comprises a first snubber film substantially disposed on a top side of at least one of the mechanical stabilizers and between the at least one mechanical stabilizer and an adjacent microelectromechanical systems (MEMS) structure;
the snubber portion comprises a second snubber film substantially disposed on a bottom side of the at least one mechanical stabilizer; and
each of the first snubber film, the second snubber film, and the at least one mechanical stabilizer are adapted to inhibit mechanical motion of the MEMS structure.

7. The flexible snubber structure of claim 1, wherein:
at least one of the mechanical stabilizers of the snubber portion is disposed adjacent to and inhibits mechanical motion of one or more microelectromechanical systems (MEMS) structures;
the flexible snubber structure and the one or more MEMS structures are integrated with one or more lenses actuated by the one or more MEMS structures to form a moveable lens module.

8. The flexible snubber structure of claim 7, further comprising:
a lens barrel; and
one or more optical devices structurally supported by the lens barrel, wherein the moveable lens module is integrated with the lens barrel and/or the one or more optical devices to form a camera module.

9. The flexible snubber structure of claim 8, further comprising:
a digital camera, a smartphone, a personal digital assistant, a computer, a tablet or notebook computer, a kiosk, or an electronic device, wherein the camera module is integrated with the digital camera, smartphone, personal digital assistant, computer, tablet or notebook computer, kiosk, or electronic device.

10. A system, comprising:
a moveable lens module;
a lens barrel; and
a flexible snubber structure disposed substantially between the moveable lens module and the lens barrel, wherein the flexible snubber structure comprises:
a ribbon portion comprising one or more electrical traces, wherein the electrical traces are at least partially electrically insulated by a ribbon film;
a substantially planar snubber portion comprising a plurality of mechanical stabilizers embedded in a snubber film; and
a folding portion coupling the ribbon portion to the snubber portion, wherein at least one of the mechanical stabilizers is electrically conductive, and wherein corresponding ones of the electrical traces are electrically coupled to the electrically conductive mechanical stabilizers.

11. The system of claim 10, wherein:
a first number of the electrically conductive mechanical stabilizers is equal to or greater than a second number of the electrical traces; and
each one of the electrical traces is electrically coupled to at least one electrically conductive mechanical stabilizer.

12. The system of claim 11, wherein:
the first number is greater than the second number;
each of the mechanical stabilizers is electrically conductive;
the mechanical stabilizers electrically coupled to the electrical traces comprise a first thickness; and
the mechanical stabilizers not electrically coupled to the electrical traces comprise a second thickness different from the first thickness.

13. The system of claim 10, wherein:
the electrical traces and the mechanical stabilizers comprise substantially the same thickness.

14. The system of claim 10, wherein:
each of the electrically conductive mechanical stabilizers comprise at least one electrical contact;
one or more patterns of the electrically conductive mechanical stabilizers are adapted to route electrical signals between corresponding electrical traces and electrical contacts; and
the corresponding electrical contacts are disposed to route electrical signals to corresponding components of the moveable lens module.

15. The system of claim 10, wherein:
the snubber film comprises a first snubber film substantially disposed on a top side of at least one of the mechanical stabilizers and between the at least one mechanical stabilizer and the moveable lens module;
the snubber portion comprises a second snubber film disposed on a bottom side of the at least one mechanical stabilizer and between the at least one mechanical stabilizer and the lens barrel; and
each of the first snubber film, the second snubber film, and the at least one mechanical stabilizer are adapted to inhibit mechanical motion of one or more microelectromechanical systems (MEMS) structures of the moveable lens module.

16. The system of claim 10, wherein:
at least one of the mechanical stabilizers of the snubber portion is disposed adjacent to and inhibits mechanical motion of one or more microelectromechanical systems (MEMS) structures of the moveable lens module.

17. The system of claim 10, wherein:
the moveable lens module, lens barrel, and the flexible snubber are integrated together to form a camera module.

18. The system of claim 16, further comprising:
a digital camera, a smartphone, a personal digital assistant, a computer, a tablet or notebook computer, a kiosk, or an electronic device, wherein the camera module is integrated with the digital camera, smartphone, personal digital assistant, computer, tablet or notebook computer, kiosk, or electronic device.

19. A method comprising:
providing a ribbon portion of a flexible snubber structure, wherein the ribbon portion comprises one or more electrical traces, and wherein the electrical traces are at least partially electrically insulated by a ribbon film;
providing a substantially planar snubber portion of a flexible snubber structure, wherein the substantially planar snubber portion comprises a plurality of mechanical stabilizers embedded in a snubber film; and providing a folding portion of a flexible snubber structure, wherein the folding portion couples the ribbon portion to the snubber portion, wherein at least one of the mechanical stabilizers is electrically conductive, and wherein corresponding ones of the electrical traces are electrically coupled to the electrically conductive mechanical stabilizers.

20. The method of claim 19, further comprising:
assembling a camera module comprising the flexible snubber structure disposed substantially between a moveable lens module and a lens barrel.

21. The method of claim 20, further comprising:
assembling a digital camera, a smartphone, a personal digital assistant, a computer, a tablet or notebook computer, a kiosk, or a portable electronic device comprising the camera module.

* * * * *

UNITED STATES PATENT AND TRADEMARK OFFICE
CERTIFICATE OF CORRECTION

| | | |
|---|---|---|
| PATENT NO. | : 8,786,967 B2 | Page 1 of 1 |
| APPLICATION NO. | : 13/844140 | |
| DATED | : July 22, 2014 | |
| INVENTOR(S) | : Guiqin Wang et al. | |

It is certified that error appears in the above-identified patent and that said Letters Patent is hereby corrected as shown below:

In the Specification

In column 7, line 26:

Change "mechanical stabilizers 135 IS may be mated" to --"mechanical stabilizers 135 may be mated"--

In column 10, line 8:

Change "OTS" to --"OIS"--

Signed and Sealed this
Seventh Day of October, 2014

Michelle K. Lee
*Deputy Director of the United States Patent and Trademark Office*